June 22, 1971 CHOU H. LI 3,585,714

METHOD FOR MAKING SOLID-STATE DEVICES

Filed Sept. 23, 1968

Inventor:
Chou H. Li

United States Patent Office 3,585,714
Patented June 22, 1971

3,585,714

METHOD FOR MAKING SOLID-STATE DEVICES

Chou H. Li, 379 Elm Drive, Roslyn, N.Y. 11576

Continuation-in-part of application Ser. No. 490,955, Sept. 28, 1965, now Patent No. 3,430,109. This application Sept. 23, 1968, Ser. No. 761,646

Int. Cl. B01j *17/00;* H01l *5/00*

U.S. Cl. 29—580 25 Claims

ABSTRACT OF THE DISCLOSURE

This disclosure discloses a novel method for making new and/or improved solid-state devices which comprises surface-contouring the device junction or active region whereby the resultant peripheral surface of this region is differentially, and often greatly, expanded into a desired geometrical shape or surface contour shape, such as a cylindrically or elliptically concave surface, another surface of revolution or, in general, a surface of oriented arcuate cross-section. This invention also describes methods that are particularly useful in connection with the surface-contouring operation, for precision solid-state material shaping, selective defective material removal, novel doping results, improved device mountings, and simple but reliable electrical interconnections.

This is a continuation-in-part of my pending application Ser. No. 490,955, filed Sept. 28, 1965, now U.S. Pat. No. 3,430,109.

This invention is useful not only in diodes or transistors, but also in many other types of existing or new solid-state devices including microcircuits, which will be optimized thereby in respect to cost, yield, breakdown voltage, leakage current, surface cooling characteristics, photo-electric energy transformation, efficiency in signal translation, stability in or sensitivity to surrounding ambients, and other performance characteristics.

Solid-state devices in general and semiconductor devices in particular must have exacting surface properties for successful operations. These devices therefore often fail by surface failure mechanisms. Such failures include many types of instability, noise, low breakdown voltage, high leakage current, unwanted injection, generation, or recombination of current carriers, and other poor characteristics. The surface of a pn, $p^+n$, $p^-n$, $pn^+$, $pn^-$, or other optoelectromagnetically active region is especially sensitive to the ambients, contaminants, impurities, or submicron floating dust particles. While not limited thereto, the invention is herein mostly described as applied to a semiconductor device having a pn junction as its optoelectromagnetically active region.

The crowded yet extremely important solid-state device industry now has billions of dollars of annual sales. The industry is full of hard-working, renowned scientists and skilled workers. Still, outstanding among the persistently serious problems is device surface passivation and control. Different passivation methods have been developed after many and continuing research efforts, each often costing millions of dollars. But none of these methods is a complete success. Leakage currents, for example, are still usually many orders of magnitude greater than the theoretically possible. Further, the characteristics of pn junction diodes and metal-semiconductor contacts are often completely dominated by surface effects or contaminants. Standard techniques to reduce the danger of surface contaminants are only partially useful, and this in combatting only one type of contaminants, i.e., field-induced mobile ions or other particles. These methods vary widely depending primarily on the manufacturer's preference, but generally consist of merely covering the geometrically unmodified junction region surfaces with layers of "inert" materials such as oxides, nitrides, glasses, or organics. But these layers, to be effective, must be both thick for good protection and yet thin for reduced mismatch stresses. They must also be permanently, chemically, and fairly continuously yet firmly bonded to the underlying solid-state materials and, therefore, cannot always or in all respects, be inert or neutral. These layers may, for example, be chemically active by introducing contaminants, diffusants, unwanted impurities, or chemical reactants. They may also be physically active by creating intolerable mismatch stresses and strains, microcracks, dislocations, or other physical defects. These layers may even be electronically active by providing unwanted dopants, carrier traps, barrier regions, shorting paths, or inductively- and capacitively-coupled surface streaks or films.

Another scheme to reduce the effect of the same type of contaminants is to bevel or taper the junction region surface. Such a scheme, though useful in some cases, is generally relatively slow, expensive, inefficient, inaccurate, and often impractical, as will be shown later in the specification. Further, a beveled junction results in junction surface expansion which is neither great nor differential, and is only moderately effective in combatting mobile ions but not helpful against contaminants from rubbing contacts with dust particles or external solid surfaces.

Thus, prior surface passivation methods by covering with foreign materials invariably more or less introduce chemically, physically, or electronically active or undesirable matters. The sometimes useful beveling technique is always costly and often inaccurate, ineffective, or impractical. This invention describes a junction region surface-contouring technique to expand, differentially and often very greatly, the junction region peripheral surface into a desired shape or surface contour. This greatly expanded surface area in the critical junction region markedly reduces the harmful electrical fields on the junction region surface and enhances the interaction of said surface with the ambient, such as for efficiently surface-cooling a high-frequency device operated under high-power conditions or required to handle unusually large energies. Further, the expanded junction surface of a prescribed geometrical shape significantly facilitates junction photoemission, or, conversely, carrier injections by light or other means, to translate, for example, an optical or radiation input signal (consisting, e.g., of substantially parallel rays of radiation particles) into an electrical or electromagnetic output signal, i.e., to transform a radiant energy on said surface into a useful electrical energy at the end or terminal planes of the device junction or active region, or vice versa. The combination of differential expansion and prescribed geometry of the junction surface provides the opportunity to specifically design even each minute junction surface area or junction region volume according to local requirements, thereby achieving additional benefits, not hitherto possible, in optimizing the overall device performance. New devices sensitively responsive, when so required, to the chemical, physical, optoelectromagnetical, or other conditions of the ambient can now be acquired at low costs. Other devices may also be made to obtain prescribed, differential interactions of the junction surface with different positions in its surrounding ambient.

In addition, novel controls of carrier generation, movement, and recombination hitherto considered impossible are now allowed inside or near the junction or active region of the device.

The objects of the invention are as follows:

(1) To overcome the problems and disadvantages of prior-art surface passivation and control methods;

(2) To obtain, in a single manufacturing step, both surface passivation and surface control on the device active region;

(3) To achieve on a device junction or active region an external or exposed peripheral surface having a prescribed geometrical shape thereacross for the optimum operation of the device, and for the protection of said surface against contamination or formation of shorting paths thereon by its rubbing contact with external solid surfaces or submicron floating particles;

(4) To produce controlled optoelectromagnetic (i.e., optical, electrical, magnetic, electro-optical, electromagnetic, and the like) device responses to the ambient, contaminants, or impurities at or near the junction region surface;

(5) To provide a new method for making electrical contacts, particularly for integrated microcircuits;

(6) To disclose improved techniques for precision material removal, particularly for surface-contouring device junction regions or for selectively removing defective materials in a device wafer, or to trim the transverse junction area to an exact size;

(7) To provide greatly expanded junction region surfaces for effective surface cooling or other energy transmission and for the passage of high-frequency skin signal currents, such as in connection with large-power, high-frequency devices; and (8) To obtain temperature-resistant electrical bonding contacts between thermoplastically mismatched materials.

Further objects and advantages of my invention will appear as the specification proceeds.

The preferred form of my invention is illustrated in the accompanying drawing, in which.

Figure 1:
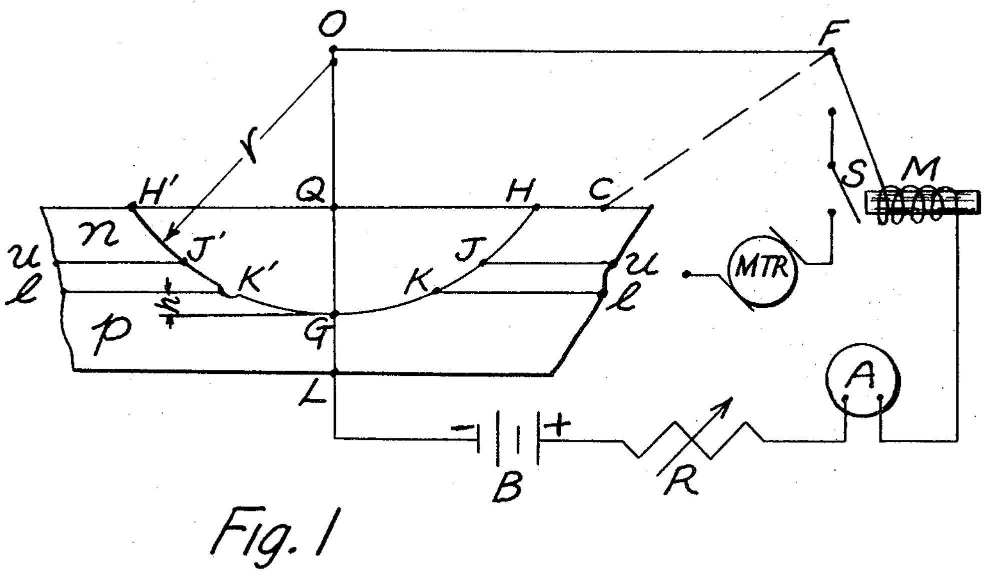
Fig. 1 PRIOR ART
FIG. 1 is a schematic diagram showing one setup to manufacture my new and/or improved semiconductor devices.

With reference to FIG. 1, my new and/or improved device may be made by choosing a pn junction in a semiconductor wafer material prepared in the usual manner, and selectively grinding or polishing the wafer surface until the junction region is reached and/or passed. A practical grinding tool may be a rotating cylinder, sphere, ellipsoid, paraboloid, cone, or specially contoured tool. Such a tool may have tiny, sharp teeth, or controlled roughness, on its grinding surface; or may have abrasive particles cemented or brazed onto the same surface. A simpler scheme is, however, to employ a smooth-surfaced tool provided with fine abrasive particles carried in a fluid medium. Small spherical or contoured rotating tools are particularly useful to locally stabilize and/or improve the surface property, to isolate minute junction regions at specific locations, to trim the junction area to an exact size, or to remove the practically unavoidable defective regions in the device wafers.

Although the rotating tool in FIG. 1 may be a cylinder, ellipsoid, sphere, or other tool with smooth surfaces or controlled surface roughnesses, the following description will be made using a rotating smooth cylinder as an example. The grinding or polishing operation is to be referred to as a "grooving" operation; and the resultant depression, or cylindrically concave surface, as a "groove."

The depth of the groove depends on the desired junction properties and the operating conditions of the device. For a discrete large device on which space is not limited, the newly exposed or grooved surface should more than extend across the entire junction or depletion region, even when the device is under its maximum operating reverse bias. Such a groove then electrically isolates the junction on the grooved side thereof. Similarly, a system of closed-end grooves, or a number of intersecting grooves, may electrically isolate several semiconductor devices from one another or from other active and passive circuit components, even on the same device wafer having a single junction region to start with. To maximize the desired results or to produce special effects, the direction of grooving may be made to coincide with a crystallographic direction of extreme atomic density, e.g., a <110> direction on a (111) wafer of silicon or germanium.

The control of the grooving depth can be achieved either manually, mechanically, or by other means. FIG. 1 shows an electrical control method in which a reverse bias is applied across the pn junction to effect the desired control. This reverse bias may be applied by means of a conductive grooving tool, as shown in FIG. 1 by the circuit BRAMSFOQGLB. Alternately, as shown by the dotted line in the same figure, part of the biasing circuit may be through a fluid conducting medium (such as an electrolyte used to carry the abrasive particles) between the grooving tool and the grooved surface of the junction, i.e., along the path CHJKG. The electrical path in this case is: BRAMSFCHJKGLB. When the junction region is ground through or nearly so, the junction becomes more or less shorted out, the electrical resistance of the above circuit drops appreciably. The reverse current then increases markedly and, by design, sufficiently to actuate the electromagnet M and switch S thereby through switch S and other easily designed means, stopping the grooving operation automatically. The grooving operation can thus be simply yet accurately controlled. Further, the groove depth on a variety of different semiconductor devices can be exactly reproduced merely by selecting a suitable reverse bias, together with a proper design of the electromagnet M, switch S, and the other accessory components. A reverse bias greater than the maximum device operating voltage and applied during the grooving operation guarantees complete electrical isolation of the active region. The result of grooving is a cylindrical groove, such as the one shown in FIG. 1 as HJGJ'H'. This groove, it will be noted, extends from underneath the junction region continuously into the upper or n-type semiconductor material.

FIG. 1 also shows that the groove not only cuts through the upper semiconducting material, but also exposes a relatively flat area (at G) in the lower (p-type) semiconducting material. Such an area may, by design, be sufficiently large to provide a convenient spot for making an electrical contact, such as by wire bonding or otherwise, to the otherwise unexposed lower semiconducting material. Even physically unexposed areas may be thus sufficiently optoelectromagnetically exposed to provide the means for other optoelectromagnetic communications with the lower semiconducting material, such as through radiation particle injection thereinto, light emission therefrom, or light signal translation therein.

Figure 2:
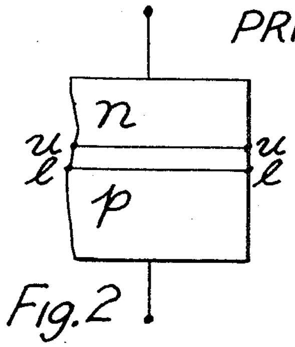
FIG. 2 is a cross-section of a mesa device introduced here for comparison with the present invention.

It can be seen, particularly in comparison with an unexpanded (or $E_m=1$) mesa junction surface shown in FIG. 2, that the junction region surface exposed by the groove is greatly expanded. At certain critical locations, this surface my be expanded 71 or more times, as will be shown.

A greatly expanded junction surface permits efficient surface cooling (the limit of air cooling being about 4 watts per square inch of exposed surface), or other surface energy transmission to or from the ambient. Further, the same surface may be so shaped and oriented in respect to the position of device during its operation that the energy transmission is made even more efficient. For example, the grooved surface should in many cases be oriented to have large projected areas in a vertical direction to achieve maximum convective cooling.

The differentially expanded peripheral surface of the junction and nearby region possesses the additional inherent property of modulating the direction of rays of radiation particles coming onto the peripheral surface for reflection. For example, in a plane locally normal to the junction region end planes, parallel incoming radiation rays are converged upon reflection by a concave peripheral surface, but diverged by a convex surface. In addition, with a cylindrically concave or many other specially contoured surfaces, this directional modulation is systematic. This means that the amount or degree of this modulation on suitable incoming rays (such as rays parallel to the direction OQGL in FIG. 1) is monotonic increasing, from a small value or zero (at G) through intermediate values (at K and J or K′ and J′) to maximum (at H and H′), along a curved line (HJKGK′J′H′) on a portion of the differentially expanded surface. Such directional modulation does not exist with linearly, or non-differentially, expanded peripheral surface.

Figure 3:
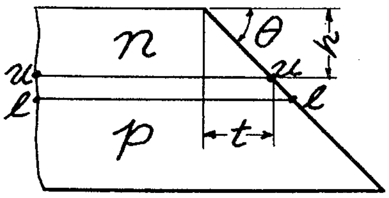
FIG. 3 is a cross-section of a beveled semiconductor device also used for comparison.

As mentioned previously, the junction region may also be exposed and, uniformly or non-differentially, expanded by beveling, that is, polishing to a bevel angle $\theta$ (FIG. 3). This method is useful in some applications. Such a method is, however, not as versatile and practical in many cases as the method according to this invention. In the beveling method, the degree of surface expansion depends only on the bevel angle $\theta$, i.e., $$E_b=(h^2+t^2)^{1/2}/h=\csc\theta=1/\sin\theta$$

Yet this bevel angle cannot be very small, or the beveled surface would extend too much laterally and device miniaturization is hampered. It is also inconvenient or impractical to obatin more than one beveled surface in a small region, or to completely isolate an active region by multiple bevelings. Beveling also requires highy skilled and costly labor exerting exact, time-consuming controls to achieve any reasonable degree of reproducibility.

On the other hand, grooving can be done easily, quickly, accurately, automatically, and inexpensively. The degree of surface expansion in grooving depends on the diameter D (or radius $r$) of the grooving cylinder and the maximum depth $h$ of the grooved surface below the position K under consideration. These parameters D and $h$ can be changed at will to meet special demands. The groove also differentially expands, on the same device wafer, or even in the same junction region, the junction surface on a microscopic scale, and can therefore be predesigned according to local surface requirements.

Grooving also easily and economically achieves more surface expansion than beveling. As seen in FIG. 1, this expansion, being related to the slope of the tangent at K to the grooved surafce GKJH, is:

$$E_g=r/(2rh-h^2)^{1/2}\doteq\csc\theta_e$$

where $\theta_e$ is the equivalent bevel angle. For very small $h$ (compared to $r$), as is usually the case, $E_g\doteq 0.707(r/h)^{1/2}$. Thus, with a 2 cm. grooving cylinder ($r$=1 cm.) and an $h$=1 $\mu$m. (micron=$10^{-4}$ cm.), the local surface expansion is $E_g\doteq 70.7$; the equivalent bevel angle $\theta_e$ then is less than 49 minutes. Such a small bevel angle is very hard to be reliably reproduced on a practical, mass-production basis at any cost.

Further, a grooved junction region (peripheral) surface, or a surface made according to the invention, is a differentially, or non-linearly expanded, surface. That is, the cross-sectional configuration of the particular surface portion is in the form of a curved line, or two intersecting lines, or a straight line intersecting a curve, rather than a single straight line.

That is, a groove differentially expands an exposed peripheral surface of the junction region into an area larger than the cross-sectional area in the thickness direction of the junction region. Further, the groove shapes the same surface to a desired geometrical shape containing at least two distinct slopes across the thickness dimension. It is to be noted that the differentially expanded surface here is of the desired or even prescribed shape, designed specifically to achieve the new and previously unknown results as described above. In addition, the same shape has, in a plane locally normal to the junction region end planes $u$—$u$ and $l$—$l$ (i.e., a plane across the junction region thickness dimension such as the plane of paper in FIG. 1), a non-linear cross-sectional configuration, such as the curve HJGJ′H′ in FIG. 1.

Advantages may be taken of this differential surface expansion effect of the cylindrical groove to design improved semiconductor devices. The heavily doped (or electronically highly conductive) semiconducting material side in the junction region, for example, may be greatly expanded locally to achieve maximum surface stabilization, or to obtain enhanced injection, emission, or other properties. The less doped (or electronically less conductive) material, on the other hand, is usually less sensitive to surface conditions or ambients; the degree of surface expansion here can therefore be small to conserve space. The grooving method is especially suited for critical applictions requiring very great surface expansions at selected points, lines, or regions, because with very small values of $h$, the local surface expansion $E_g$ can even approach infinity.

Thus, maximum junction surface expansion with a cylindrical groove is obtained when the lower end or terminal plane ($l$—$l$ in FIG. 1) of the junction region is tangent to the groove. For a junction region 1 $\mu$m. (or $10^{-4}$ cm.) thick and a groove radius $r$=1 cm., the surface expansion at the lowest point or point of tangency (where $h$=0) approaches infinity, while the same expansion at the upper end or terminal plane ($u$—$u$ in FIG. 1) of the junction region is 70.7, as indicated above. The total surface expansion for the entire 1 $\mu$m. junction region is, by integration, 141.4. That is, the exposed surface has now been expanded 141.4 times to 141.4 $\mu$m. wide, from the original 1 $\mu$m. This figure of total expansion (ratio) for the entire junction region is given in the accompanying table, together with other such figures for different combinations of $r$ and $h_m$. In this table, $h_m$ refers to the value of $h$ at the lowest point (i.e., G in FIG. 1) on the cylindrical groove. A positive or negative $h_m$ indicates that G is respectively below or above the lower plane of the junction region. It can be seen from the table that for a given $h_m$, the surface expansion increases by about threefold for every tenfold increase in $r$. Further, for most combinations of $r$ and $h_m$, the surface expansion greatly exceeds 5.76×, the practical maximum for beveling. Even this expansion of 5.76× requires a bevel angle $\theta$ of less than 10°, which is already very hard to be reproducibly made even on only one side of a simple device.

The same table shows, in addition, that the surface expansion is sensitively related to $h_m$, or the depth of the groove. Greatly expanded surfaces cannot, therefore, be obtained or reproducibly achieved unless the grooving operator is clearly and specifically taught to carefully and accurately position the groove with respect to the microscopically thin junction region. The surface expansion for grooves having shapes other than cylinders can be similarly computed.

TABLE I

Surface expansion for different $r$ and $h_m$, junction=1μm. thick or wide

| $h_m/r$= | $10^2$ cm. | 10 cm. | 1 cm. | $10^{-1}$ cm. | $10^{-2}$ cm. | $10^{-3}$ cm. | $10^{-4}$ cm. |
|---|---|---|---|---|---|---|---|
| −0.9μm | 448.5 | 141.6 | 44.72 | 14.14 | 4.47 | 1.415 | 0.451 |
| −0.5μm | 1,001 | 316.3 | 100.0 | 31.62 | 10.00 | 3.176 | 1.047 |
| −0.1μm | 1,343 | 424.3 | 134.2 | 42.43 | 13.43 | 4.275 | 1.471 |
| 0.0μm | 1,414 | 447.2 | 141.4 | 44.73 | 14.15 | 4.510 | 1.571 |
| 0.1μm | 1,035 | 327.6 | 103.6 | 32.77 | 10.37 | 3.319 | 1.220 |
| 1.0μm | 585.9 | 185.2 | 58.58 | 18.53 | 5.88 | 1.925 | ---- |
| 5.0μm | 301.9 | 95.45 | 30.19 | 9.56 | 3.06 | 1.121 | ---- |
| 20.0μm | 156.2 | 49.39 | 15.63 | 4.96 | 1.65 | ---- | ---- |

It can be seen that while beveling may moderately expand the junction region surface (typically from 2.8× to 5.7×), grooving usually greatly expands the same surface (50× to 500×) and, in particular, may selectively expand infinitely certain critical points, lines, or regions. An expanded junction surface is well-known to reduce junction contamination by reducing the surface field gradient and hence the oriented accumulation of mobile ions and floating particles, to be called Type I contaminants hereinafter. On a junction region (peripheral) surface with a reduced field gradient, the contaminating ions or particles already accumulated thereon are more easily removed or detached by shaking, gas jet blowing, washing, or etching.

Grooving, or other surface-contouring, accomplishes an added desirable result, i.e., the elimination of residual shunting streaks of Type II contaminants resulting from the rubbing contacts of the junction region with relatively moving external solid surfaces. The effect of Type II contaminants is not well-recognized but is ever present and often extremely serious. These unavoidable contaminants may be in the form of greases, oxides, nitrides, dust films, and metallic or non-metallic layers on the surface of jigs, dies, tools, tweezer tips, operators' fingers and nylon gloves, or on the inside wall of beakers or other containers. It has been found that even the most effective chemical cleaning methods leave several atomic layers of impurity films. These contaminants may also come from relatively moving dust particles, metal platings or coatings, or even a higher-conductivity semiconducting material on a neighboring device. These particles, coatings, etc., may even have sizes smaller than the active junction width. To avoid these contaminants in the form of rubbed-on streaks, the junction must be surface-contoured. No beveling no matter how much, is effective against these contaminants.

Although Type II contaminants are made less dangerous if the device is surface-passivated by a layer of oxide, nitride, glass, organics, and the like, these contaminants may still damage the device before, or even during, such very passivation steps in the device manufacture. Further, these layers invariably contain pinholds, fissures, microcracks, . . . and often fail to protect against Type I contaminants.

However, any of these relatively inert layers, applied to junction surface sufficiently differentially expanded to combat effectively against Type I and II contaminants, will give added protection to the junction against being physically rubbed and contaminated.

The residual surface streaks of contaminants may, in extreme cases, be desirable to control surface carrier injection, movement or recombination. But generally these surfaces streaks are to be avoided; because they may inductively or capacitively couple undesirably with, or simply short out, the junction region. As an example, a single rubbing contact of the junction region with the gold-plated film of a neighboring device may introduce a shorting streak consisting of only a single atomic gold chain. This chain, for a 1-μm. junction region, is computed to contain some 3,903 gold atoms weighing the indetectable $1.28\times10^{-18}$ grams but, nevertheless, having an electrical resistance of some 0.334 megohm, thereby giving a leakage current of 0.15 ma. at a reverse voltage of 50 volts. Such a high leakage current often makes the device totally unfit for its intended use.

A contacting flat surface may easily and badly contaminate a beveled junction region surface, particularly if there is a relative motion between the junction and flat contacting surface to enhance abrasion and material transfer. A moving dust particle may also contaminate the same junction surface. A cylindrically or otherwise curvedly groove junction can only be contaminated by dust particles having exactly matching geometries and relative movements, i.e., ideally smooth concave on convex surfaces with identically the same radii at the contact region and relatively rotating exactly along the axis of the groove. This is practically impossible. A non-yielding, flat surface can therefore never contaminate such a grooved junction by a single or even repeated rubbing contacts. Similarly, contamination by a single rubbing particle of a junction surface with either *two* linear tapers thereon, or a small groove on a large groove (such as shown by the small curve in FIG. 1 at K') or, in general, any continuous or discontinuous change of slope at any point therein, is also very unlikely because the particle must then suddenly change direction of movement at the right time and by the precise amount. This is again impossible because the particle has finite radius, size, mass, and momentum. Elastic or plastic deformation of the rubbing surfaces only slightly increases the chance of contamination by Type II contaminants.

According to the above considerations, either or both of the solid-state materials adjoining the junction region may, with advantage, be surface-contoured or differentially expanded, this surface-contouring cooperating with the junction surface-contouring to further lessen the chance of junction contamination by rubbing contacts, particularly when the external solid surfaces are larger in sizes than the junction width or thickness.

The effects of Type I and Type II contaminants may locally complement or reinforce each other. For example, an incomplete shunting streak of Type II contaminants may locally build up an intense field thereby attracting Tpye I contaminants to fill in the gap. An incomplete streak of Type I contaminants may also produce a concentrated field strong enough to modify the trajectory of a nearby moving particle thereby increasing the chance of complete shunting.

Other unique and beneficial effects of grooving or surface-contouring have already been previously indicated. Dependent on the type of possible contaminants and device design, use or manufacturing procedures, one may put more emphasis on reducing Type I or II contaminants, or on achieving other special effects; and thus select the best surface contour and optimum combination of $r$ and $h_m$. For maximum surface expansion, one should use as large an $r$ but as small an $h_m$ as possible, giving maximum protection against Type I contaminants but relatively small protection against Type II contaminants. On the other hand, if Type II contamination problem is very serious, or if hundreds, or more, of closely-spaced circuit elements must be isolated from one another on a single 1-cm. wafer in microcircuitry work, $r$ must necessarily be small, thereby providing less, though often adequate, protection against Type I contaminants.

A further advantage of the grooving method is that the grooving cylinder can be controllably tilted relative to the device wafer or junction region end planes $u$—$u$ and $l$—$l$ during the grooving operation. This tilting action adds an additional dimension to the control of surface expansion. The junction surface can now be cylindrically differentially expanded not only in the transverse direction, but also in the longitudinal direction, thereby achieving differently differential expansion. Differently differential expansion can also be obtained on a conical surface. Additional beneficial features, or even new devices, can thereby be easily and inexpensively made. Such new devices include position-sensitive radiation particle counter useful, for example, in computer input or readout devices.

The grooved region generally suffers some mechanical damages. These damages may or may not be serious. Severely damaged materials can easily be removed by suitable annealings or special skin chemical etches.

Another application of grooving or surface-contouring is as follows. By grooving a narrow but deep groove, or drilling, into the device solid-state material, and applying the right amount of dopants at selected locations in the resultant groove or hole, one can obtain point, line, or surface type of diffusion source. This source is three-dimensional, i.e., inside the solid-state material at the exact position wanted, rather than two-dimensional as in the conventional surface diffusion sources. After allowing the source to diffuse, one obtains novel junction configuration or structure having special characteristics. Other methods of introducing foreign or doping atoms, such as ion implantation, can also be used in conjunction with the special groove or hole to achieve similar results.

In yet another application, one may start with a slab of intrinsic material with a single groove on the top surface, such as that in FIG. 1, or with the same slab but alignedly grooved on both top and bottom surfaces. Next, n- and p-type dopants are diffused in, respectively from the top and bottom surfaces. The result is a curved pn or pin junction structure. The junction periphery here is surrounded by intrinsic material, well inside the slab. There is, in this case, no externally exposed pn or pin junction surfaces. This technique therefore yields a unique and special guard-ring structure with distinctly improved performances.

Figure 4:
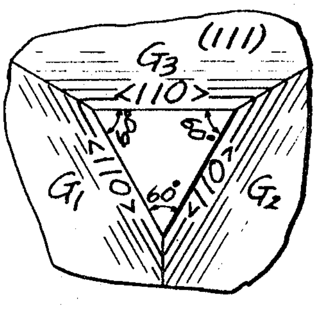
FIG. 4 is a plan view of one version of my new device.

FIG. 4 shows a small semiconductor device whose active junction area is defined and isolated by three intersecting cylindrical grooves: $G_1$, $G_2$, and $G_3$. As shown, these grooves are in the <110> directions on (111) silicon or germanium device wafer. These directions represent crystallographic directions of maximum atomic packing densities. Unwanted, microscopic cracks that are difficult to detect yet may significantly affect device performances are less likely to occur if grooving is done along these directions. Similarly, a square device on (111) silicon may have one of its four sides (or 25% of the periphery) coinciding with the <110> direction, to achieve partial but significant improvement over random orientations.

Figure 5:
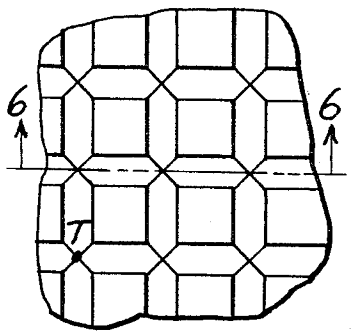
FIG. 5 is a top view of a novel microcircuit piece containing a system of normally intersecting grooves.
Figure 6:
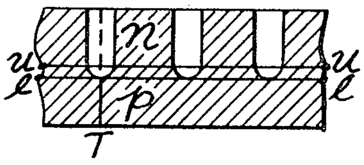
FIG. 6 is a cross-section of the device of FIG. 5, taken along the line 6—6.

FIG. 5 shows a top view of a piece of a monolithic microcircuitry broken off from a 1 cm. x 1 cm. semiconducting wafer containing, say, 30×30 or 900 individual, isolated or discrete units of circuit elements. Notice that there are two groups of linear and mutually perpendicular grooves. FIG. 6 shows a vertical cross-section of the same microcircuitry piece taken along line 6—6 of FIG. 5. In this cross-section the grooves are partly cylindrical and the bottom lines of the grooves lie in the lower (end or terminal) plane surface of the junction region thereby achieving maximum surface expansion. Each of the isolated or discrete circuit elements may be made to operate independently of the others in a specified signal translation operation therein with a performance improved by the differentially expanded junction surface thereon provided by the grooving system.

FIGS. 5 and 6 also show, at T in the figures, a dislocation, a microprecipitate, a zone of resistivity variation, or other defect. Such a defect, when present in a shallow junction under reverse bias, is often easily visible or located as a microplasma hot spot junction region end under an infrared scanning or even ordinary microscope.

The grooving system here is positioned and extended to remove the portion of defect shown by the dotted line in FIG. 6, i.e., the portion just above the lower junction plane *l—l*. This makes the defect ineffective in harmfully influencing the device performances. The junction region in other such applications may or may not be substantially differentially expanded or improved by such defect-removing processes.

When the microcircuit piece of FIGS. 5 and 6 is bonded by alloying, sultrasonic, thermocompression or other methods, upside down onto (or with the gridded side of the device facing) a substrate, new results obtain. The substrate physically prevents dust from getting near the grooved junction surfaces. The substrate may be electrically conductive so that a good electrical contact results. In addition, the grooves act as mismatch stress and strain relievers, but not as stress raisers because of the rounded tips or bottoms, thereby reducing or eliminating the harmful (thermoplastic) mismatch stresses and strains between the substrate and the solid-state material.

Figure 7:
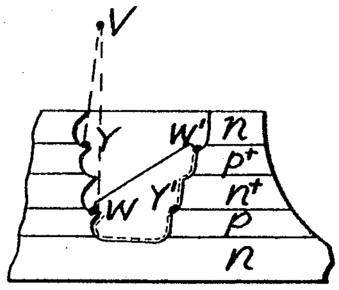
FIG. 7 is a cross-section of a "universal integrated circuit" showing the unique circuit structure and novel interconnections contained therein.

FIG. 7 shows a portion of an integrated circuit which is "universal" because it may be designed to contain innumerable combinations of active and passive circuit components, such as diodes, triodes, tetrodes, . . . resistances, capacitances, and the like. Yet the circuit has only five carefully chosen semiconducting material layers from which all these individual components are made. These layers are one on top of the other, alternately p and n in electronic conductivity type, i.e., n, $p^+$, $n^+$, p, and n from top down. From these layers, four pairs of diodes are obtainable, i.e., $np^+$, $p^+n$; $p^+n^+$, $n^+p^+$; $n^+p$, $pn^+$; and pn, np. Further, three pairs of triodes or transistors are possible, i.e., $np^+n^+$, $n^+p^+n$; $p^+n^+p$, $pn^+p^+$; and $n^+pn$, $npn^+$. Besides, two pairs of tetrodes can be made therefrom, i.e., $np^+n^+p$, $pn^+p^+n$; and $p^+n^+pn$, $npn^+p^+$. In addition, a single pair of pentodes is available, i.e., $np^+n^+pn$ ( top down), $npn^+p^+n$ (bottom up). Excluding the two pentodes, there are altogether 18 possible active components each with its unique operating characteristics. From these same five semiconducting layers, numerous additional resistances, capacitors, and other passive components can also be made.

For the general case having *m* semiconducting layers present, the number of possible circuit components are: $2(m-1)$ diodes, $2(m-2$ triodes, $2(m-4)$ tetrodes, and so on. Altogether, there are $6(m-2)$ diodes, triodes, and tetrodes combined.

The second and third (from top down) semiconducting layers have superscripts "+" to indicate very heavily doped p- and n-type materials respectively. These superscripts may be replaced by "−" signs in some cases to indicate very lightly doped materials. Two more useful combinations of semiconducting layers thus obtain: $np^-n^-pn$ and $np^-p^-n$.

The stack of multiple, integral semiconducting layers requires only a few more processing steps to become an integrated circuit. These steps are: component isolation, surface passivation and/or improvement, and interconnection. Herein the present invention comes to the help admirably, by isolating the different components, passivating and improving their junction region surfaces, and providing sufficiently large contact areas for the interconnections, all in a single, low-cost manufacturing step. In fact, the use of the instant invention may be necessary. This is seen as follows. The semiconducting layers may be only 5 μm. or even less thick. The base widths of transistors, in particular, usually are only 0.5 μm. thick. Gold-bonding with 25-μm. (1-mil) gold wire requires a space of some 100 μm. in diameter. This space the geometrically unmodified or even the beveled junction (maximum expansion about 6× giving a space of 30 μm.) cannot provide, but the surface-contoured junction can. An example of interconnection between components by grooving and wire bonding is shown as W–W′ in FIG. 7. It is to be noted that the different peripheral surfaces of the two circuit elements here are grooved differently to achieve different results. Also, the grooved junctions at or near, for example, Y and W, may be self-shielding or -masking for the metallizing evaporation source at V, so that only the contact areas at Y, W, . . . are selectively metallized.

An alternative interconnection technique is also shown in the same figure by the dotted line W'Y'W. This technique comprises: (1) grooving the components or circuit elements; (2) forming, by oxidation or vapor deposition for example, an insulating or other high-impedance layer on the newly-exposed surfaces; (3) selectively removing the high-impedance layer at predesignated contact areas, such as at W, W', and Y'; and (4) forming, by vapor or chemical deposition or otherwise, conductive or other low-impedance path directly on and across the expanded junction region surfaces to connect all the contact areas. Crossed low-impedance paths can also be electronically separated from each other by a similar high-impedance layer therebetween.

Although so far only grinding has been described, other surface-contouring methods can be designed and are often equally useful or effective. Such methods include the use of an aligned or focussed ion, electron, laser, or other energetic particles beam to take off material by evaporation or other surface activation processes. In all these methods, the energy-carrying beam particles are intercepted by the junction region surface thereby delivering the carried energy to locally and intensely heat up or energize the intercepting surface atoms to the point of evaporation or ejection. To remove material on different parts of the junction surface, these beams should be moved relatively to the same surface. Laser beams can be controlled by simple, stable optices while electron beams by electrostatic deflecting means. Further, these energetic beams often not only take off materials but also supply the necessary thermal or optoelectromagnetic signals to the device whose response thereto may be monitored to measure or regulate the process of the material-removal operation.

Laser and electron beams often have sufficient resolution or accuracy to practice this invention. The solid-state device may then be preheated before the surface-contouring operation to reduce the thermal shock stresses and strains and, therefore, to minimize the danger of fractures or cracks forming therein. In many other cases, however, the solid-state device should be precooled or refrigerated, to a low temperature tolerable by the device, so that beam heating is more localized or confined thereby resulting in better dimensional and configurational control of the material-removal zones. Precooling the device may be particularly desirable or necessary if the solid-state materials contain highly activated, low-melting eutectic, or other materials, at subgrain boundaries, or in other defective regions such as dislocations. These materials may be more or less preferentially melted, evaporated, oxidized, or otherwise unfavorably modified or disturbed. Refrigeration reduces the danger of such preferential, penetrating, or non-uniform type of material removal.

Precooling illustrates an important principle or precision material removal. Precooling deactivates the solid-state material with respect to material-removal by surface evaporation or ejection; it makes the material resistant, the more so the farther away from the surface, to being heated to evaporation or ejection temperatures. This insures removal of only thin surface layers and results in controlled and uniform or non-preferential removal of successive thin surface layers at selected spots. A rapidly turned-off beam, fast beam travel, and cooling after beam passage allow even greater control in the material-removal operation.

It is to be noted that grooving by mechanical means, in which thin surface layers are successively ground off, also admirably meets at least some of the requirements of the above principle of precision material removal.

On the other hand, conventional chemical etching processes, particularly those of the simple dipping type, usually results in junction surface degradation and is not well-adapted to exact surface-contouring for differential surface expansion of the active region. This is because many etching solutions are, firstly, highly unpredictable in performance and often have to be mysteriously "aged" for unspecified times before they can be used at all. Etching also liberates much heat giving rise to unpredictable localized temperature rises, solution disturbances, composition changes, or even some control-defeating runaway phenomena. Further, active materials or physical defects in the solid-state materials tend to form tiny galvanic cells and often to be preferentially etched out. This unregulated, preferential, or pentrating type of material removal is often made more so in the presence of the surrounding physically sound, though electrolytically cathodic, solid-state material. This is in contrast to material-removal operations by focussed energizing beams where the same surrounding materials somehow help to absorb or dissipate the incoming energies. Besides, solid-state materials are neither homogeneous nor isotropic, but full of impurities, dislocations, dangling bonds, and many other defects causing wide variations in local etching rates. A single dislocation which is usually normal to the active region may, for example, form a preferentially etched-out or shorting path thereby destroying the effectiveness of the differentially expanded surface in combatting contaminants. The presence of built-in electrostatic or electrolytic field potential at the active region certainly does not help the situation either. Hence, conventional etching by dipping is not very useful in precision surface-contouring of the microscopically thin active region according to this invention.

However, novel and useful precision chemical etching techniques can be devised as follows. First, refrigerate the solid-state device to reduce its overall chemical activity. A thin layer of an etchant (preferably of the non-penetrating type) is then applied for a very brief period of time so that only the surface portion of the material is reactivated enough to be etched away. This is followed by an immediate deactivation with rapid quenching or water rinsing. This procedure of quick etching an immediate quenching is then repeated as often as is necessary. In such a procedure, like in mechanical grinding, or grooving, the preceding material-removing suboperations leave little residual effects, i.e., do not appreciably change the local or overall rate or uniformity of material-removal in subsequent removal suboperations. The following steps or precautions further improve the etching: drying and/or flash thermal or chemical preferential activation of the surface atoms to be etched away just before etching, etching with small, high-velocity, tangential jet of hot concentrated ($HF+HNO_3$) etching solution, decativating the defects by covering, masking, or otherwise, and carrying the etchant in a viscous or non-penetrating type of medium. An electrolytic etching with a closely-spaced contour-surfaced cathode, together with a low-conductivity electrolytic bath to replace the chemical etching solutions described above, should also give improved etching results.

Although junction region surface-contouring is easily done by selectively removing material from an already-formed junction region, the contouring results can also be achieved by forming or shaping the junction with a contoured surface thereon, i.e., by systematically varying the transverse or cross-sectional area of the junction region to cause its peripheral surface to assume the prescribed geometrical shape. Such junction-forming methods include controlled doping or dopant redistribution by diffusion, ion implantation, or otherwise; or depositing successive layers of junction-forming materials against a contoured object; or oxidizing a p-type substrate into an oxide (e.g., from Si to $SiO_2$) in the form of a groove followed by diffusing n-type dopants from the top surface to give a structure also representable by FIG. 1.

While the invention has been described with particular reference to the rectifying pn junction region of a semiconductor device, the invention applies equally well to many other types of junction or active regions, such as metal-oxide, metal-semiconductor, or other optoelectromagnetically active regions. Each of such active regions is formed between two solid-state materials which have different optoelectromagnetic properties including electronic carrier conductivity, mobility, or lifetime; and photoelectric or thermoelectric properties. The greater the numerical values of these properties, the greater the optoelectromagnetic activity of the solid-state material. The two solid-state materials also have different Fermi (or electron energy) levels; the active region thus forms a transition region therebetween. Another common characteristic of such an active region is that the electronic current therein is determined not only by majority carriers, but to an appreciable or even a greater extent by minority carriers in the form of drifting and diffusing currents. Yet another chacteristic of this region is that it has a lower electronic conductivity, due to depleted carrier concentrations, compared to those of the two adjoining solid-state materials, when a reverse bias is applied thereto. A typical example of an optoelectromagnetically active region is an interfacial rectifying barrier region, which includes, as a special case, the well-known pn junction region.

The invention is not to be construed as limited to the particular forms disclosed herein, since these are to be regarded as illustrative rather than restrictive.

What is claimed is:

1. A method for making an improved solid-state device of the type having an optoelectromagnetically active region of appreciable thickness and formed between two solid-state materials of differing electronic conductivity type for the translation of optoelectromagnetic signals of a specific kind and having device characteristics sensitive to the area and surface contour of the peripheral surface of the active region, comprising: providing two solid-state materials of differing electronic conductivity type and forming an active region of appreciable thickness therebetween, and shaping an exposed peripheral surface of the active region into an area larger than the cross-sectional area in the thickness direction and to a desired geometrical shape containing at least two distinct slopes across the thickness dimension, so as to differentially expand the peripheral surface of the active region and thereby improve the device characteristics.

2. The method of claim 1 wherein the differential shaping step comprises systematically varying in a predetermined manner the transverse or cross-sectional area of the active region with the depth or thickness thereof during the formation of the active region thereby causing the peripheral surface thereof to assume the desired geometrical shape.

3. The method of claim 1 wherein the shaping step includes expanding the peripheral surface such that the surface expansion thereof varies from point to point in two directions respectively locally normal and parallel to the thickness direction.

4. The method of claim 1 wherein the two solid-state materials have different optoelectromagnetic activities and the shaping step includes expanding the peripheral surface progressively more and more toward the optoelectromagnetically more active solid-state material.

5. The method of claim 1 including the additional step of expanding the peripheral surface of at least a portion of one of the solid-state materials according to a substantially continuous extension of the desired geometrical shape.

6. The method of claim 1 including the additional step of introducing doping atoms into a preselected region through an area on the differentially expanded peripheral surface.

7. The method of claim 1 wherein the active region is an interfacial rectifying barrier region, the signal translation is achieved at least partly through body effects, and the device characteristics include resistance of the peripheral surface to contamination by mobile ions and rubbing contacts with external solid surfaces including submicron particulate surfaces, and wherein the shaping step comprises selectively removing material from the peripheral surface to form the desired geometrical shaping having across the thickness dimension a non-linear cross-sectional configuration substantially unmatchable dynamically by the rubbing solid surfaces such that the resultant differentially expanded peripheral surface is made resistant, through curvature effects, to contamination by the rubbing contacts.

8. The method of claim 7 including the additional step of covering the differentially expanded barrier region peripheral surface with shielding material thereby preventing subsequent physical contact of the peripheral surface with external solid surfaces.

9. The method of claim 7 wherein the material-removing step includes optoelectromagnetically exposing on one of the solid-state materials an area originally optoelectromagnetically unexposed and including the additional step of providing means for optoelectromagnetically communicating with the one solid-state material through the newly exposed area thereon.

10. The method of claim 7 wherein the material-removing step includes physically exposing on one of the solid-state materials an area originally hidden underneath the other solid-state material and the barrier region and including the additional step of attaching one end of an elongated electrically conductive metal lead in the newly exposed area on the one solid-state material.

11. The method of claim 7 wherein the material-removing step comprises surface-contouring at least a critical portion of the barrier region periphery into a substantially differentially expanded cylindrically concave surface.

12. The method of claim 7 wherein the solid-state materials contain regions that normally are preferentially removed by the material-removing step and including the additional step of deactivating the solid-state materials including the barrier region and the preferentially removable regions, the materials being thus made resistant to the material-removing operation progressively more so with increasing distance from a selected surface thereof, only the selected surface of the deactivated solid-state materials being then sensitive to the material-removing operation so as to insure that only a substantially uniform surface layer is removed by each material-removing operation.

13. The method of claim 7 wherein the material-removing step comprises locating a material-removing tool spaced from the barrier region, providing means for monitoring the degree of material removal based on the differential optoelectromagnetic properties between the solid-state materials and the barrier region, applying an optoelectromagnetic signal to the device at least partly through the barrier region, the response of the device to the signal being related to the degree of material removal on the peripheral surface, removing material from the peripheral surface, monitoring the response, and stopping the material-removing operation when the response so monitored has changed by a specified amount.

14. The method of claim 7 wherein the material-removing step comprises removing material according to a preselected grid pattern so as to form a system of intersecting grooves originating in one of the solid-state materials while penetrating at least partly into the barrier region but not completely through the other solid-state material and having at least partly an oriented arcuate cross-section in the barrier region to substantially differentially expand the barrier region peripheral surface into a larger area of a desired geometrical shape and also to substantially isolate electronically discrete units of solid-state components one from the other.

15. The method of claim 14 wherein the device is to be rigidly mounted onto a substrate having thermoplastic properties substantially different from those of the one solid-state material and including the additional step of bonding the gridded side of the device onto the substrate so as to allow the intersecting grooves acting as mismatch stress and strain relievers.

16. The method of claim 7 wherein the material-removing step comprises locating a material-removing tool spaced from the barrier region, providing an electrically conductive path between the tool and the device, applying a reverse bias through the conductive path across the barrier region, moving the tool relatively to the barrier region to cut a concave peripheral surface thereinto, monitoring the reverse current of the device, and stopping the material-removing operation when the reverse current has increased by a specified amount.

17. The method of claim 7 wherein the material-removing step is accomplished by means of a beam of energy-carrying particles, at least a portion of the particles possessing energies exceeding the bonding energy between atoms in the solid-state materials, said particles, upon being intercepted by the peripheral surface, deliver the carried energy to activate the peripheral surface atoms to the point of separation from the other atoms.

18. The method of claim 1 wherein the differential shaping step includes expanding the peripheral surface by a depression in the form of a surface of revolution whose axis is substantially parallel to the thickness direction.

19. The method of claim 1 wherein the shaping step includes expanding the peripheral surface into a cross-sectional curve across the thickness dimension and representable on rectangular coordinates by a second-degree mathematical equation.

20. The method of claim 1 wherein the shaping step includes expanding the peripheral surface across the thickness dimension into a cross-sectional curve having a tangent thereto located within microns of and oriented substantially parallel to one end plane of the active region.

21. The method of claim 1 including providing means for significantly interacting with electronic carriers underneath the peripheral surface to thereby modify, in a predetermined manner, the device characteristics through changes in at least one of the electronic carrier behaviors inside the region but near the peripheral surface, the behaviors including carriers generation, carriers movement, and carriers recombination.

22. The method of claim 7 wherein the signals comprise substantially parallel rays of radiation particles coming onto the peripheral surface for reflection and the shaping operation differentially expands the peripheral surface to such a surface contour that across said thickness dimension-respectively the degree of directional modulation of the rays reflected from a portion of the differentially expanded peripheral surface varies monotonically from a small value to a maximum.

23. A method for making surface-passivated solid-state device comprising: forming at least one pn junction region of appreciable thickness between a plurality of contiguous, cooperating solid-state materials of alternately p and n types, the number of solid-state materials being at least one greater than the number of pn junction regions and shaping an exposed peripheral surface of the junction region into an area larger than the cross-sectional area in the thickness direction and to a desired geometrical shape containing at least two distinct slopes across the thickness dimension, so as to differentially expand and passivate the peripheral surface of the junction region.

24. The method of claim 23 including the additional step of providing low-impedance material in electronic communication with at least one designated point on the differentially expanded peripheral surface.

25. The method of claim 24 wherein the low-impedance material is in the form of a thin-film layer, and including the additional step of providing a thin-film, high-impedance layer on the differentially expanded peripheral surface and located at least partly underneath but in direct physical contact with the low-impedance material layer.

References Cited

UNITED STATES PATENTS

| | | | |
|---|---|---|---|
| 3,255,055 | 6/1966 | Ross | 148—1.5X |
| 3,260,634 | 7/1966 | Clark | 29—25.3X |
| 3,304,595 | 2/1967 | Katsuo et al. | 29—591 |
| 3,320,496 | 5/1967 | Topas | 317—234 |
| 3,355,568 | 11/1967 | Hirai et al. | 29—583 |
| 3,496,617 | 2/1970 | Cook et al. | 29—583 |

JOHN F. CAMPBELL, Primary Examiner

W. TUPMAN, Assistant Examiner

U.S. Cl. X.R.

29—583

UNITED STATES PATENT OFFICE
CERTIFICATE OF CORRECTION

Patent No. 3,585,714 Dated June 22, 1971

Inventor(s) Chou H. Li

It is certified that error appears in the above-identified patent and that said Letters Patent are hereby corrected as shown below:

Column 1, line 17, "contour shape" should read --shape--. Column 4, line 26, "BRAMSFOQGLB" should read --BRAMFOQGLB--; line 32, "BRAMSFCHJKGLB" should read --BRAMFCHJKGLB--. Column 9, line 74, delete "junction region end". Column 10, line 10, "sultrasonic" should read --ultrasonic--; line 44, "2 triodes, 2(m-4)" should read --2) triodes, 2(m-3)--; line 54, "$np^-p^-n$" should read --$npn^-p^-n$--. Column 11, line 59, "or" should read --of--. Column 12, line 42, "an" should read --and--. Column 13, line 47, delete "differential". Column 14, line 7, "shaping" should read --shape--; line 73, "a desired" should read --the desired--. Column 15, line 27, delete "differential". Column 16, line 6, delete "-respectively".

Signed and sealed this 28th day of March 1972.

(SEAL)
Attest:

EDWARD M.FLETCHER,JR.
Attesting Officer

ROBERT GOTTSCHALK
Commissioner of Patents

FORM PO-1050 (10-69) USCOMM-DC 60376-P69
U.S. GOVERNMENT PRINTING OFFICE : 1969 O—366-334